(12) United States Patent  (10) Patent No.: US 9,190,600 B2
Clark  (45) Date of Patent: Nov. 17, 2015

(54) LARGE-DEFLECTION MICROACTUATORS

(71) Applicant: Purdue Research Foundation, West Lafayette, IN (US)

(72) Inventor: Jason V. Clark, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 342 days.

(21) Appl. No.: 13/907,242

(22) Filed: May 31, 2013

(65) Prior Publication Data

US 2013/0334928 A1   Dec. 19, 2013

Related U.S. Application Data

(60) Provisional application No. 61/724,097, filed on Nov. 8, 2012, provisional application No. 61/659,221, filed on Jun. 13, 2012.

(51) Int. Cl.
*H01L 41/09* (2006.01)
*H02N 2/02* (2006.01)

(52) U.S. Cl.
CPC ............ *H01L 41/0973* (2013.01); *H01L 41/09* (2013.01); *H01L 41/0946* (2013.01); *H01L 41/0953* (2013.01); *H02N 2/028* (2013.01)

(58) Field of Classification Search
USPC .................................................. 310/311–370
See application file for complete search history.

(56) References Cited

U.S. PATENT DOCUMENTS

| | | | |
|---|---|---|---|
| 4,769,569 A | 9/1988 | Stahlhuth | |
| 5,834,879 A | 11/1998 | Watanabe et al. | |
| 6,188,526 B1 | 2/2001 | Sasaya et al. | |
| 7,508,117 B2 * | 3/2009 | Takeuchi | H04N 5/2253 200/181 |
| 8,064,142 B2 | 11/2011 | Batchko et al. | |
| 2004/0207293 A1 | 10/2004 | Seeley | |
| 2005/0253487 A1* | 11/2005 | Allan | H01L 41/33 310/331 |
| 2009/0261688 A1* | 10/2009 | Xie | B81B 3/0035 310/307 |
| 2010/0237751 A1 | 9/2010 | Bosch et al. | |
| 2010/0245517 A1* | 9/2010 | Miyazawa | B41J 23/00 347/104 |
| 2010/0245966 A1* | 9/2010 | Yasuda | H01L 41/0953 359/224.1 |

OTHER PUBLICATIONS

IBM Technical Disclosure Bulletin, Mar. 1, 1975, "Precision Specimen Table Positioner", vol. 17, Issu3 10, p. 3171.*
Fearing, Ronald S., Powering 3 Dimensional Microrobots: Power Density Limitations, (1998 Tutorial on Micro Mechatronics and Micro Robotics), Sep. 27, 1998, (total 15 pgs.).
Piezo Systems, Inc., "Introduction to Piezo Transducers" (2011) (9 pgs.) as printed on May 22, 2013, found at http://www.piezo.com/tech2intropiezotrans.html (total 9 pgs.).
Thielicke, E. et al., "Microactuators and Their Technologies", Mechatronics, Published 2000 by Elsevier Science Limited, 0957-4158/00/$ PII: S0957-4158(99) 00063-X, pp. 431-455 (total 25 pgs.).

(Continued)

*Primary Examiner* — Thomas Dougherty
(74) *Attorney, Agent, or Firm* — Lee & Hayes, PLLC; Christopher J. White

(57) ABSTRACT

Actuators using piezoelectric drives, S-drives, or S-flexures are disclosed. The actuators can include S-drives connected in series to deflect substantially in a common deflection direction. The actuators can also include pairs of piezoelectric elements connected together for rotation in the plane of the pairs. An arm assembly and a forearm assembly can each have a plurality of S-flexures for deflection along substantially orthogonal axes.

4 Claims, 15 Drawing Sheets

(56) References Cited

OTHER PUBLICATIONS

Jain, A. et al., "A Thermal Bimorph Micromirror with Large Bi-Directional and Vertical Actuation", Sensors and Actuators, 122(1), 2005, pp. 9-15 (total 7 pgs.).
Wu, L., et al., 2009, "Electrothermal Micromirror with Dual-Reflective Surfaces for Circumferential Scanning Endoscopic Imaging", Journal of Micro/Nanolithography MEMS MOEMS, 8(1), pp. 13-30 (total 7 pgs.).
Hah, D. et al., "Low-Voltage, Large-Scan Angle MEMS Analog Micromirror Arrays with Hidden Vertical Comb-Drive Actuators", Journal of Microelectromechanical Systems, 2004, 13(2), pp. 279-289 (total 4 pgs.).
Lee, C, "Design and Fabrication of Epitaxial Silicon Micromirror Devices", Sensors and Actuators, 2004, 115, pp. 581-591 (total 10 pgs.).
Kota, S. et al, "Tailoring Unconventional Actuator Using Compliant Transmissions: Design Methods and Applications", IEEE/ASME Transactions Mechatronics, 1999, (4), pp. 396-408 (total 13 pgs.).
Cho, I. J. et al., "A Low-Voltage Three-Axis Electromagnetically Actuated Micromirror for Fine Alignment among Optical Devices", Journal of Microelectromechanics and Microengineering, 2009, 19(8), pp. 1-9 (total 9 pgs.).
Sniegowski, J. J. et al., 1996, "Monolithic Geared-Mechanisms Driven by a Polysilicon Surface- Micromachined on-Chip Electrostatic Microengine", Proceedings of Solid-State Sensor and Actuator Workshop, pp. 1-7, (total 7 pgs.).
Grade, J. D. et al., 2003, "Design of Large Deflection Electrostatic Actuators", Journal of Microelectromechanical Systems, 12(3), pp. 335-343, (total 9 pgs.).
Tang, W. C. et al., 1989, "Laterally Driven Polysilicon Resonant Microstructures", IEEE, pp. 53-59 (total 8 pgs.).
Howe, R. T. et al., 1986, "Resonant-Microbridge Vapor Sensor", IEEE Transactions on Electron Devices, 33(4), pp. 499-506, (total 8 pgs.).
Aronson. R. B., 1984, "Rediscovering Piezoelectrics", Machine Design, pp. 73-77, (total 6 pgs.).
Fang, J. et al., 2006, "Self-Assembly of PZT Actuators for Micropumps with High Process Repeatability", Journal of MicroMechanical Systems, 15(4), pp. 871-878, (total 8 pgs.).
Doelle, M. et al., 2006, "Piezo-FET Stress-Sensor Arrays for Wire-Bonding Characterization", Journal of MicroMechanical Systems, 15(1), pp. 120-130, (total 11 pgs.).
Senousy, M. S., et al., 2008, "Thermo-electro-mechanical Performance of Piezoelectric Stack Actuators for Fuel Injector Applications", Journal of Intelligent Material Systems and Structures, 20, pp. 387-399 (total 14 pgs.).
Wasa, K. et al., 2012, "Thin-Film Piezoelectric Materials fr a better Energy Harvesting MEMS", Journal of MicroMechanical Systems, 21(2), pp. 451-457, (total 7 pgs.).
Williams, M. D. et al., "An Ain MEMS Piezoelectric Microphone for Aeroacoustic Applications", Journal of MicroMechanical Systems, 2012, 21(2), pp. 270-283, (total 14 pgs.).
King, T. et al., "Piezoactuators for Real World Applications, Can they Deliver Sufficient Displacement", Power Engineering Journal, 14(3), 2000, pp. 105-110, (total 6 pgs.).
Hong, E. et al., "Design of MEMS PZT Circular Diaphragm Actuators to Generate Large Deflections", Journal of MicroMechanical Systems, 2006, 15(4), pp. 832-839, (total 8 pgs.).
Kommepalli, H. K. R. et al., 2009, "Design, Fabrication, and Performance of a Piezoelectric Uniflex Microactuator", Journal of MicroMechanical Systems, 18(3), pp. 616-625, (total 10 pgs.).
Koh, K. H. et al., "A Piezoelectric-Driven Three Dimensional MEMS VOA using Attenuation Mechanism with Combination of Rotational and Translational Effects", Journal of MicroMechanical Systems, 2010, 19(6), pp. 1370-1379, (total 10 pgs.).
Hishinuma, Y. et al., "Piezoelectric Unimorph Microactuator Arrays for Single-Crystal Silicon Continuous-Membrane Deformable Mirror", Journal of MicroMechanical Systems, 2006, 15(2), pp. 370-379, (total 10 pgs.).
Oldham, K. R. et al., "Thin-Film PZT Lateral Actuators with Extended Stroke", Journal of MicroMechanical Systems, 2008, 17(4), pp. 890-899, (total 10 pgs.).
Zhou, H. et al., "Linear Piezo-Actuator and its Applications", via http at zhouhx.tripod.com /piezopaper.pdf, (total 5 pgs.).
Conway, N. J. et al., "A Strain Amplifying Piezoelectric MEMS Actuator", Journal of Micromechanics and Microengineering, 17, pp. 781-787, 2007, (total 8 pgs.).
Gabrielson, T. B. et al., "Final Report for Failure Analysis of High-Power Piezoelectric Transducers", Office of Naval Research, Pennstate, Dec. 31, 2005, (total 17 pgs.).
Bashash, S. et al., "Robust Multiple Frequency Trajectory Tracking Control of Piezoelectrically Driven Micro/Nanopositioning Systems," IEEE Trans. on Control Sys. Techn., vol. 15, No. 5, pp. 867-878, 2007, (total 12 pgs.).
Fleming, A. J. et al., "Sensorless vibration suppression and scan compensation for piezoelectric tube nanopositioners," IEEE Trans. on Control Systems Technology, vol. 14, No. I , pp. 33-44, 2007, (total 12 pgs.).
Howland. R. et al., "A practical guide to scanning probe microscopy. ThermoMicroscopes," Mar. 2000, (total 16 pgs.).
Kochervinskii, V. "Piezoelectricity in Crystallizing Ferroelectric Polymers". Crystallography Reports, 2003, 48 (4): 649-67, (total 27 pgs.).
Clark, J. et al. "Using MEMS as self-calibrating forcedisplacement transducers: a theoretical study," NSTI-nanotech, 2010, (total 5 pgs.).
Li, F. et al. "Practical measurements of stiffness, displacement, and comb drive force of MEMS," IEEE UGIM, 2010, (total 6 pgs.).

\* cited by examiner

LARGE-DEFLECTION MICROACTUATORS

CROSS-REFERENCE TO RELATED APPLICATIONS

This application is a nonprovisional application of, and claims priority of, U.S. Provisional Patent Application Ser. Nos. 61/659,221, filed Jun. 13, 2012, and 61/724,097, filed Nov. 8, 2012, the entirety of each of which is incorporated herein by reference.

FIELD OF THE INVENTION

The present application relates to microelectromechanical systems (MEMS), and particularly to MEMS piezoelectric microactuators.

BACKGROUND

Microelectromechanical systems (MEMS) are commonly fabricated on silicon (Si) or silicon-on-insulator (SOI) wafers, much as standard integrated circuits are. However, MEMS devices include moving parts on the wafers as well as electrical components. Examples of MEMS devices include gyroscopes, accelerometers, and microphones. MEMS devices can also include actuators that move to apply force on an object. Examples include microrobotic manipulators. However, various existing MEMS actuator schemes have a small operating range (e.g., motion only on the order of tens of microns) or require position feedback external to the MEMS (e.g., a laser and photodiode system). There is a continuing need, therefore, for improved microactuators, including microactuators that have a larger operating range than prior actuators.

"Powering 3 Dimensional Microrobots: Power Density Limitations" by Fearing (1998 Tutorial on Micro Mechatronics and Micro Robotics) describes various types of microactuators, including piezoelectric microactuators.

"Introduction to Piezo Transducers" (2011) by PIEZO SYSTEMS, Inc., pg. 1, shows examples of longitudinal (d33) and transverse (d31) piezoelectric motors. In a longitudinal motor, a layer of piezoelectric material extends parallel to an applied electric field. In a transverse motor, a layer of piezoelectric material extends perpendicular to an applied electric field. This document, FIG. 2, shows a single layer transverse motor with voltage applied on the top and bottom of the layer. The sides contract with applied electric field, causing a change in length $\Delta L_{out}$.

Reference is made to US20040207293, US20100237751, U.S. Pat. No. 4,769,569, U.S. Pat. No. 5,834,879, U.S. Pat. No. 6,188,526, U.S. Pat. No. 7,508,117, and U.S. Pat. No. 8,064,142.

Reference is made to the following:
[1] Thielicke, E., and Obermeier, E., 2000, "Microactuators and their Technologies", Mechatronics, pp. 431-455.
[2] Jain, A., Qu, H., Todd, S., and Xie, H., 2005, "A Thermal Bimorph Micromirror with Large Bi-Directional and Vertical Actuation", Sensors and Actuators, 122(1), pp. 9-15.
[3] Wu, L., and Xie, H., 2009, "Electrothermal Micromirror with Dual-Reflective Surfaces for Circumferential Scanning Endoscopic Imaging", Journal of Micro/Nanolithography MEMS MOEMS, 8(1), pp. 13-30.
[4] Hah, D., Huang, H. S. Y., Tsai, J. C., Toshiyoshi, J. C., and Wu, M. C., 2004, "Low-Voltage, Large-Scan Angle MEMS Analog Micromirror Arrays with Hidden Vertical Comb-Drive Actuators", Journal of Microelectromechanical Systems, 13(2), pp. 279-289.
[5] Lee, C., 2004, "Design and Fabrication of Epitaxial Silicon Micromirror Devices", Sensors and Actuators, 115, pp. 581-591.
[6] Kota, S., Hetrick, J., Li, Z., and Saggere, L., 1999, "Tailoring Unconventional Actuator Using Compliant Transmissions: Design Methods and Applications", IEEE/ASME Transactions Mechatronics, 4(4), pp. 396-408.
[7] Cho, I. J., and Yoon, E., 2009, "A Low-Voltage Three-Axis Electromagnetically Actuated Micromirror for Fine Alignment among Optical Devices", Journal of Microelectromechanics and Microengineering, 19(8), pp. 1-9.
[8] Sniegowski, J. J., Miller, S. L., LaVigne, G. F., Rodgers, M. S., and McWhorter, P. J., 1996, "Monolithic Geared-Mechanisms Driven by a Polysilicon Surface-Micromachined on-Chip Electrostatic Microengine", Proceedings of Solid-State Sensor and Actuator Workshop, pp. 1-7.
[9] Grade, J. D., Jerman, H., and Kenny, T. W., 2003, "Design of Large Deflection Electrostatic Actuators", Journal of Microelectromechanical Systems, 12(3), pp. 335-343.
[10] Tang, W. C., Nguyen, T. C. H., and Howe, R. T., 1989, "Laterally Driven Polysilicon Resonant Microstructures", IEEE, pp. 53-59.
[11] Howe, R. T., and Muller, R. S., 1986, "Resonant-Microbridge Vapor Sensor", IEEE Transactions on Electron Devices, 33(4), pp. 499-506.
[12] Aronson, R. B., 1984, "Rediscovering Piezoelectrics", Machine Design, pp. 73-77.
[13] Fang, J., Wang, K., and Bohringer, K. F., 2006, "Self-Assembly of PZT Actuators for Micropumps with High Process Repeatability", Journal of MicroMechanical Systems, 15(4), pp. 871-878.
[14] Doelle, M., Peters, C., Ruther, P., and Paul, O., 2006, "Piezo-FET Stress-Sensor Arrays for Wire-Bonding Characterization", Journal of MicroMechanical Systems, 15(1), pp. 120-130.
[15] Senousy, M. S., Li, F. X., Mumford, D., Gadala, M., and Rajapakse, R. K. N. D., 2008, "Thermo-electro-mechanical Performance of Piezoelectric Stack Actuators for Fuel Injector Applications", Journal of Intelligent Material Systems and Structures, 20, pp. 387-399.
[16] Wasa, K., Matsushima, T., Adachi, H., Kanno, I., and Kotrea, H., 2012, "Thin-Film Piezoelectric Materials fr a better Energy Harvesting MEMS", Journal of MicroMechanical Systems, 21(2), pp. 451-457.
[17] Williams, M. D., Griffin, B. A., Reagan, T. N., Underbrink, J. R., and Sheplak, M., 2012, "An AIn MEMS Piezoelectric Microphone for Aeroacoustic Applications", Journal of MicroMechanical Systems, 21(2), pp. 270-283.
[18] King, T., Pozzi, M., and Manara, A., 2000, "Piezoactuators for Real World Applications, Can they Deliver Sufficient Displacement", Power Engineering Journal, 14(3), pp. 105-110.
[19] Hong, E., McKinstry, S. T., Smith, R. L., Krishnaswamy, S. V., and Freidhoff, C. B., 2006, "Design of MEMS PZT Circular Diaphragm Actuators to Generate Large Deflections", Journal of MicroMechanical Systems, 15(4), pp. 832-839.
[20] Kommepalli, H. K. R., Muhlstein, C. L., McKinstry, S. T., Rahn, C. D., and Tadigadapa, S. A., 2009, "Design, Fabrication, and Performance of a Piezoelectric Uniflex Microactuator", Journal of MicroMechanical Systems, 18(3), pp. 616-625.
[21] Koh, K. H., Lee, C., and Kobayashi, T., 2010, "A Piezoelectric-Driven Three Dimensional MEMS VOA using Attenuation Mechanism with Combination of Rotational and Translational Effects", Journal of MicroMechanical Systems, 19(6), pp. 1370-1379.

[22] Hishinuma, Y., and Yang, E. H., 2006, "Piezoelectric Unimorph Microactuator Arrays for Single-Crystal Silicon Continuous-Membrane Deformable Mirror", Journal of MicroMechanical Systems, 15(2), pp. 370-379.

[23] Oldham, K. R., Pulskamp, J. S., Polcawich, R. G., and Dubey, M., 2008, "Thin-Film PZT Lateral Actuators with Extended Stroke", Journal of MicroMechanical Systems, 17(4), pp. 890-899.

[24] Zhou, H., Henson, B., Bell, A., Blackwood, A. Beck, A. and Burn, R., "Linear Piezo-Actuator and its Applications", via http at zhouhx.tripod.com/piezopaper.pdf

[25] Conway, N. J., Traina, Z. J., and Kim, S. G., 2007, "A Strain Amplifying Piezoelectric MEMS Actuator", Journal of Micromechanics and Microengineering, 17, pp. 781-787.

[26] COMSOL, Inc. 744 Cowper Street, Palo Alto, Calif. 94301, USA, www.comsol.com

[27] Yang, J., 2005, "An Introduction to the Theory of Piezoelectricity", Springer Science and Business Media, N.Y.

[28] Gabrielson, T. B., 2005, "Final Report for Failure Analysis of High-Power Piezoelectric Transducers", Office of Naval Research, Pennstate.

Reference is also made to the following:

[B1] B. C. Crandall, "Nanotechnology: Molecular Speculation on Global Abundance," Cambridge, Mass.: MIT Press, 1996.

[B2] B. Bhushan, "Handbook of Micro/Nano Tribology," Boca Raton, Fla.: CRC, 1995.

[B3] M. Yves, "Scanning Probe Microscopes," Bellingham, Wash.: SPIE, 1995.

[B4] S. Bashash and N. Jalili, "Robust Multiple Frequency Trajectory Tracking Control of Piezoelectrically Driven Micro/Nanopositioning Systems," IEEE Trans. on Control Sys. Techn., vol. 15, no. 5, pp. 867-878, 2007.

[B5] A. 1. Fleming and S. O. R. Moheimani, "Sensorless vibration suppression and scan compensation for piezoelectric tube nanopositioners," IEEE Trans. on Control Systems Technology, vol. 14, no. I, pp. 33-44, 2007

[B6] R. Howland and L. Benatar "A practical guide to scanning probe microscopy. ThermoMicroscopes," March 2000.

[B7] Kochervinskii, V. "Piezoelectricity in Crystallizing Ferroelectric Polymers". Crystallography Reports, 2003, 48 (4): 649-675.

[B8] J. Clark, F. Li, H. Lee, etc. "Using MEMS as self-calibrating forcedisplacement transducers: a theoretical study," NSTI-nanotech, 2010.

[B9] F. Li and J. Clark, "Practical measurements of stiffness, displacement, and comb drive force of MEMS," IEEE UGIM, 2010.

BRIEF DESCRIPTION

According to an aspect of the invention, there is provided an actuator, comprising:

a) a plurality of S-drives, each having a first end and a second end, the S-drives mechanically connected in series at their first ends and second ends alternately, each S-drive including:

i) four piezoelectric elements disposed substantially in a respective common plane of the S-drive and arranged as a first and a second pair of the piezoelectric elements, the piezoelectric elements in each pair spaced apart and mechanically coupled at their ends, and the first and second pairs mechanically connected in series to define the first and second ends of the S-drives; and ii) first and second electrodes arranged so that voltage applied to the first electrode causes deformation of a first piezoelectric element of the first pair and a second piezoelectric element of the second pair, and voltage applied to the second electrode causes deformation of a second piezoelectric element of the first pair and a first piezoelectric element of the second pair;

iii) one or more common electrode(s), each common electrode arranged opposite the first electrode or opposite the second electrode in a direction substantially normal to the respective common plane; and b) a controller adapted to selectively apply voltage of a first polarity between the first electrode and at least one of the common electrode(s) facing the first electrode, and contemporaneously apply voltage of a second polarity opposite to the first polarity between the second electrode and at least one of the common electrode(s) facing the second electrode, so that each of the S-drives deflects substantially in the respective common plane and substantially in a common deflection direction.

According to another aspect of the invention, there is provided an actuator, comprising:

c) a plurality of piezo-drives mechanically connected in series at respective ends thereof to define an actuator plane, each piezo-drive including two piezoelectric elements disposed to define a respective common plane of the piezo-drive, wherein the respective common planes are substantially perpendicular to the actuator plane and the piezoelectric elements in each piezo-drive are spaced apart and mechanically coupled at their ends;

d) a plurality of electrodes arranged so that, when voltage is applied across the electrodes, one piezoelectric element in each piezo-drive extends with respect to the other piezoelectric element in that piezo-drive, so that each piezo-drive deflects out of the actuator plane, and arranged so that piezo-drives that are mechanically connected to each other deflect in opposite directions; and e) a controller adapted to selectively apply voltage across the electrodes.

According to another aspect of the invention, there is provided positioning apparatus, comprising:

f) a fixed shoulder, an elbow, and a probe;

g) an arm assembly including a plurality of S-flexures connected between the shoulder and the elbow and adapted to displace the elbow with respect to the shoulder along a first axis; and h) a forearm assembly including a plurality of S-flexures connected between the elbow and the probe and adapted to displace the probe with respect to the elbow along a second axis substantially orthogonal to the first axis.

Various aspects advantageously provide a wide operating range. Various aspects include built-in position sensing.

This brief description of the invention is intended only to provide a brief overview of subject matter disclosed herein according to one or more illustrative embodiments, and does not serve as a guide to interpreting the claims or to define or limit the scope of the invention, which is defined only by the appended claims. This brief description is provided to introduce an illustrative selection of concepts in a simplified form that are further described below in the detailed description. This brief description is not intended to identify key features or essential features of the claimed subject matter, nor is it intended to be used as an aid in determining the scope of the claimed subject matter. The claimed subject matter is not limited to implementations that solve any or all disadvantages noted in the background.

BRIEF DESCRIPTION OF THE DRAWINGS

The above and other objects, features, and advantages of the present invention will become more apparent when taken in conjunction with the following description and drawings wherein identical reference numerals have been used, where possible, to designate identical features that are common to the figures, and wherein.

Figure 1:
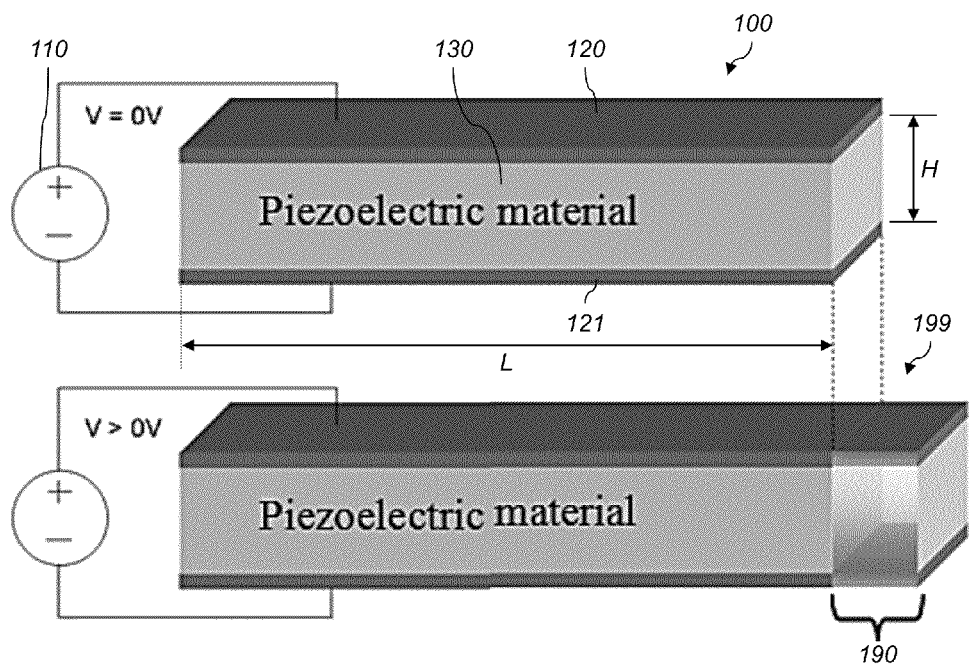
FIG. 1 shows a perspective side view of a piezoelectric actuator.

The attached drawings are for purposes of illustration and are not necessarily to scale.

DETAILED DESCRIPTION

Throughout this description, some aspects are described in terms that would ordinarily be implemented as software programs. Those skilled in the art will readily recognize that the equivalent of such software can also be constructed in hardware (hard-wired or programmable), firmware, or micro-code. Accordingly, aspects of the present invention may take the form of an entirely hardware embodiment, an entirely software embodiment (including firmware, resident software, or micro-code), or an embodiment combining software and hardware aspects. Software, hardware, and combinations can all generally be referred to herein as a "service," "circuit," "circuitry," "module," or "system." Various aspects can be embodied as systems, methods, or computer program products. Because data manipulation algorithms and systems are well known, the present description is directed in particular to algorithms and systems forming part of, or cooperating more directly with, systems and methods described herein. Other aspects of such algorithms and systems, and hardware or software for producing and otherwise processing signals or data involved therewith, not specifically shown or described herein, are selected from such systems, algorithms, components, and elements known in the art. Given the systems and methods as described herein, software not specifically shown, suggested, or described herein that is useful for implementation of any aspect is conventional and within the ordinary skill in such arts.

Various aspects relate to extremely-large-deflection actuators for translation or rotation. An inventive piezoelectric microactuator according to various aspects can produce extremely large translational (>100 microns) or rotational deflections (>10 degrees). Many micro electro mechanical systems (MEMS) are capable of deflecting from ones to tens of microns using the electrostatic or thermoelectric phenomenon. However, electrostatic actuators are often constrained to operate in clean environments, which limits their utility to physically interact with the environment. Thermal actuators usually require a relatively large amount of power since they rely on heat. Large-deflection actuators without such constraints can be useful in, e.g., biomedical engineering, optics, micro/nano-assembly, or scanning probe microscopy. Piezo actuators according to various aspects exploit lateral deflection to create an actuator that forms an 'S' shape upon actuation. This S-drive can be used to construct large-translational and -rotational actuators. Feasibility analysis can be performed and can consider nonlinear deflection, voltage limit due to dielectric breakdown, strain limit, and gravitational effects.

Various symbols used herein are set forth in Table 1, below:

TABLE 1

| | |
|---|---|
| d | Piezoelectric strain constant |
| h | Thickness |
| L | Initial length |
| $M_0$ | Initial moment |
| V | Applied voltage |
| w | Width |
| Y | Beam deflection |
| Y"(x) | Curvature |
| y | Distance from the neutral axis |
| ΔL | Change in length |
| $\epsilon_{max}$ | Maximum strain |
| ρ | Radius of curvature |
| ε | Strain |

Various prior schemes have attempted to develop actuation methods in MEMS for applications requiring displacements more than 50 μm. Some examples of actuators which have been able to reach this displacement include thermal actuation approaches [2-3], electrostatic [4-5], mechanically amplified deflections [6], magnetic [7] and the use of rotary motors and ratchets [8]. Though all of these actuators managed to provide large displacements, the response time is rarely less than 20 ms [2], [5-6], [8], and amplification of the displacement usually comes at the cost of reduced force. Actuators which achieve fast response include parallel plate actuators which generally have a very limited range about one-third of the starting gap, and have to be feedback-controlled to achieve useful response. Grade [9] proposed the improved Tang's [10] comb-drive actuator which offers a displacement of 150 microns within 1 ms at an operating voltage of less than 150V. The drawback with this scheme is that the electrostatic force is linear only if the amplitude of vibration is limited to a small fraction of the capacitor gap. The quality factor Q of the resonance is very low at atmospheric pressure because of squeezed film damping in the micron-sized capacitor gap [11]. In order to obtain a very high Q the microstructure should be resonated in vacuum which means that these sensors have difficulty operating without vacuum packaging.

Piezoelectric materials can convert mechanical energy to electrical energy or electrical energy to mechanical energy. The phenomenon of generating strain upon application of voltage or electric charge to a piezoelectric material is known as converse piezoelectric phenomenon. Actuators and sensors working on these principles have high force and low power consumption capabilities [12], which provide a range of applications in micropumps [13], stress sensors [14], microrobots [15], energy harvesters [16], and aeroacoustics [17]. Though piezoelectric actuators give a positional accuracy of under several nanometers, their applications can be limited due to their small displacements [18].

Some piezoactuators and the maximum displacement achieved by them are given as follows. Hong in [19] proposed a PZT diaphragm actuator that could generate a maximum displacement of 7 μm at an applied voltage of 100V. Kommepalli in [20] presented a piezoelectric microactuator that gave a maximum displacement of 4.6 μm at 10V. In [21] Koh presented an array of PZT cantilevers that could give a displacement of 30 μm for an applied voltage of 2V. Four PZT unimorph membrane microactuator with a displacement of 2.5 μm at 50V was shown in [22]. In [23] Oldham presented a PZT lateral actuator that gave a maximum lateral displacement of 5 μm at 20V. To reduce the limitation of small displacement, a multi-layer design known as piezo stack actuator which could reach a displacement of 250 μm was developed by Zhou [24]. But this produced a corresponding reduction in force. In [25] Conway developed a strain amplifying piezoelectric MEMS actuator which had a peak displacement of 1.18 μm. In contrast, various aspects of actuators described herein have been shown in simulation to be capable of deflecting greater than 100 microns, and can be capable of rotating greater than 10 degrees.

Below is described the basic piezoelectric mechanism behind a novel S-drive actuator; the S-drive; strain and breakdown characteristics of an actuator; simulated performance of a system of nested S-drives, which is capable of deflecting 1000 microns translationally; and various aspects of a nested S-drive used to form a twistoflex actuator (described below), which is able to rotate 360 degrees.

In the piezoelectric mechanism, energy is transduced between electrical and mechanical domains by piezoelectric material. Application of mechanical stress on the ceramic induces an electric charge, and this phenomenon is known as the direct piezoelectric effect which is generally employed in sensor applications. Actuator applications use a phenomenon where an application of an electric field across the ceramic creates a mechanical strain which is called the converse piezoelectric effect.

FIG. 1 shows a perspective side view of a piezoelectric actuator exhibiting the converse piezoelectric phenomenon. Voltage source 110 applies voltage across thin conductive layers 120, 121 disposed on opposite sides of the piezoelectric material 130 in a height (thickness) direction H. Insulative piezoelectric material 130 is arranged between the thin conductive layers 120, 121 is shown. Material 130 and layers 120, 121 form cantilever 100. As shown in configuration 199, an applied voltage causes an axial elongation 190 that is about a thousandth of the original length L of cantilever 100. Elongation 190 is a 0.1% extension, and is shown magnified. This is an example of a transverse motor, as discussed above, since the elongation 190 (horizontal, along L) is perpendicular to the applied field V from voltage source 110 (vertical, along H).

In various aspects, disregarding any hysteresis effects, the relationship between strain and electric field strength for a single piezo element in a longitudinal motor when a voltage is applied along the length of that element [18] is:

$$\frac{\Delta L}{L} = dE. \quad (1)$$

where L is the initial length, ΔL is the change in length, the proportionality constant d is the piezoelectric strain constant (mV$^{-1}$), and E is the electric field strength. In a longitudinal motor, unlike in FIG. 1, the electric field strength is $$E = \frac{V}{L}. \quad (2)$$

In an example of a transverse motor such as that shown in FIG. 1, the strain-field relationship is as in (1). The electric field strength is:

$$E = \frac{V}{H} \quad (2B)$$

Substituting (1) into (2) gives $$\Delta L = dV. \quad (3)$$

which implies that change in length depends only on the applied voltage V. Eq. (3) also applies for transverse motors, e.g., as shown by the "Transverse Expansion" equation on pg. 9 of the above-referenced "Introduction to Piezo Transducers" document (2011). It is well-known in the piezoelectric art that ΔL and V can have either a positive or a negative sign. Depending on the polarity of the piezoelectric material, positive V will produce either expansion (ΔL>0) or contraction (ΔL<0) and negative V will produce contraction (ΔL<0) or expansion (ΔL>0).

Figure 2:
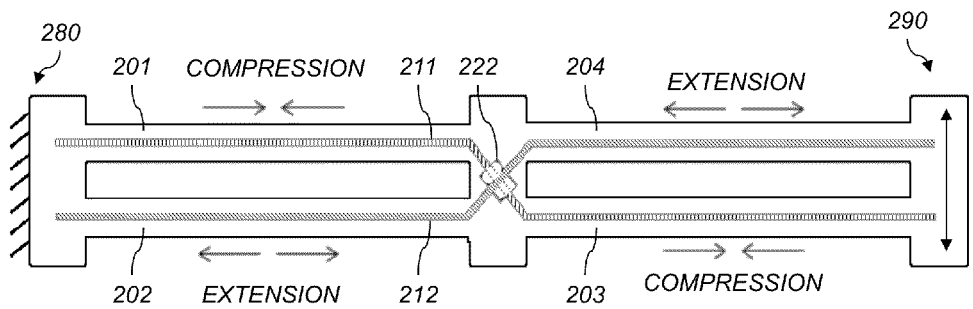
FIG. 2 shows a top view of an S-drive according to various aspects.

FIG. 2 shows a top view of an S-drive according to various aspects. This S-drive is similar to the flexure shown in FIGS. 14 and 15, discussed below. In this aspect piezo material is sandwiched between two metal strips. The circuit shown in FIG. 1 can be used. The top strips (corresponding, e.g., to electrode 120 in FIG. 1) are represented graphically in this top view as hatched stripes. The bottom strips (corresponding, e.g., to electrode 121 in FIG. 1) are not shown, and can be as shown in FIG. 1. Four of these strips 201, 202, 203, 204 are placed as shown. Voltage is applied such that compression on one side and extension on the other produces an S-drive. For example, the voltage is applied such that one side gets compressed and the other side gets extended. Electrode 211 extends along strips 201 and 203 and carries a voltage that compresses strips 201, 203. Electrode 212 extends along strips 202 and 204 and carries a voltage that extends strips 202, 204. Electrodes 211, 212 are electrically isolated from each other, as shown at crossover 222 that electrically insulates electrodes 211, 212 from each other. This configuration is an example of what is referred to herein as an "S-Drive.".

Figure 3:
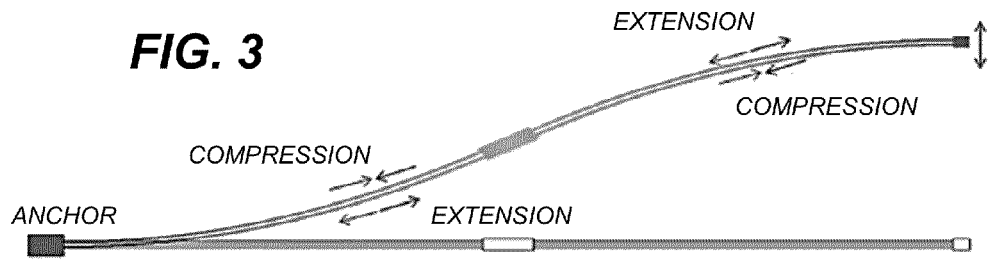
FIG. 3 shows an example of the operation of an S-drive.

FIG. 3 shows an example of the operation of an S-drive. The piezoelectric flexure forms a "S" shape due to the large deflection. Application of voltage to the piezo crystal sandwiched between conductors as shown in FIG. 2 produces the S-Drive. The geometric properties used for the simulation are length L=250 μm, width, thickness, and gap are w=h=gap=2 μm. A voltage of 40V across the conductors produces a deflection of $1.754 \times 10^{-4}$ m.

For simulation the piezo plane stress module of COMSOL [26], a finite element analysis software, is used. The linear piezoelectric equations are:

$$\sigma = c_E \epsilon - e^T E$$

$$D = e\epsilon + \epsilon_0 \epsilon_{rS} E$$

$$\epsilon = s_E \sigma + d^T E$$

$$D = d\sigma + \epsilon_{rT} E. \quad (4)$$

where s is the stress matrix, E c is the elasticity matrix, e is the strain matrix, e is the coupling matrix, rS e is the relative permittivity, 0 e is the permittivity of free space, E s is the compliance matrix, d is the coupling matrix, and rT e is the relative permittivity.

$$\sigma = \begin{bmatrix} \sigma_{xx} \\ \sigma_{yy} \\ \sigma_{zz} \\ \tau_{yz} \\ \tau_{xx} \\ \tau_{xy} \end{bmatrix} \quad \epsilon = \begin{bmatrix} \epsilon_{xx} \\ \epsilon_{yy} \\ \epsilon_{zz} \\ 2\epsilon_{yz} \\ 2\epsilon_{xz} \\ 2\epsilon_{xy} \end{bmatrix} \quad (5)$$

The strains are calculated as the Green-Lagrange strain $$\epsilon_{ij} = \frac{1}{2}\left(\frac{du_i}{dx_j} + \frac{du_j}{dx_i} + \frac{du_k}{dx_i} \cdot \frac{du_k}{dx_j}\right). \quad (6)$$

Piezoelectric materials can have strain limits and electric field break down limits. Strain is the ratio of change in length ΔL to original length L. Using the length AB before deformation and A'B' after deformation, the strain is:

$$\epsilon = \frac{(A'B' - AB)}{AB}. \quad (7)$$

The are lengths are given by $$A'B' = (\rho - y)d\theta. \quad (8)$$

$$AB = \rho d\theta. \quad (9)$$

Substituting (8) and (9) into (7) gives $$\epsilon = \frac{y}{\rho}. \quad (10)$$

where y is the distance from the neutral axis, and ρ is the radius of curvature which equals the inverse of curvature ( ) "Y x which gives $$\epsilon = yY''(x). \quad (11)$$

The curvature Y" at any point x along the beam is given by $$Y''(x) \equiv \frac{(M_0 + F(L - x))}{EI}. \quad (12)$$

Integrating (12) twice gives the beam deflection as $$Y(x) = \frac{\left(\frac{1}{2}M_0 x^2 + F\left(\frac{Lx^2}{2} - \frac{x^3}{6}\right)\right)}{EI}. \quad (13)$$

By substituting x=L in (13) the tip deflection of the beam is determined to be:

$$Y(x = L) = \frac{\left(\frac{1}{2}M_0 L^2 + \frac{1}{3}FL^3\right)}{EI}. \quad (14)$$

An assumption of initial moment $M_0$ to be zero in (14) gives $$FL = \frac{3EIY}{L^2}. \quad (15)$$

Substituting (15) into (12) gives $$Y''(x = 0) = \frac{3Y}{L^2}. \quad (16)$$

Substituting (16) into (11) gives $$\epsilon = \frac{3yY}{L^2}. \quad (17)$$

It is known that maximum strain occurs at the corners of the beam where y=w/2. By substituting this into (14) the maximum strain is $$\epsilon_{max} = \frac{3Yw}{2L^2}. \quad (18)$$

The strain limit of piezoelectric material ranges from 0.1% for many crystals to 4% for piezo polymers. Various actuators described herein can be designed with consideration of such limits. Piezoelectric material according to various aspects is held together by layers of ductile conductive material, so such devices may be able to survive deflection beyond the fractures produced by surpassing the strain limit. For single crystal PZT, the electric field break down limit was determined to be about 50V/mm; Gabrielson in [28] gives 1V/mm as a safe drive level for hard PZT, and Measurement Specialties give a value of 80V/mm for their PVDF piezopolymer.

Figure 4A:
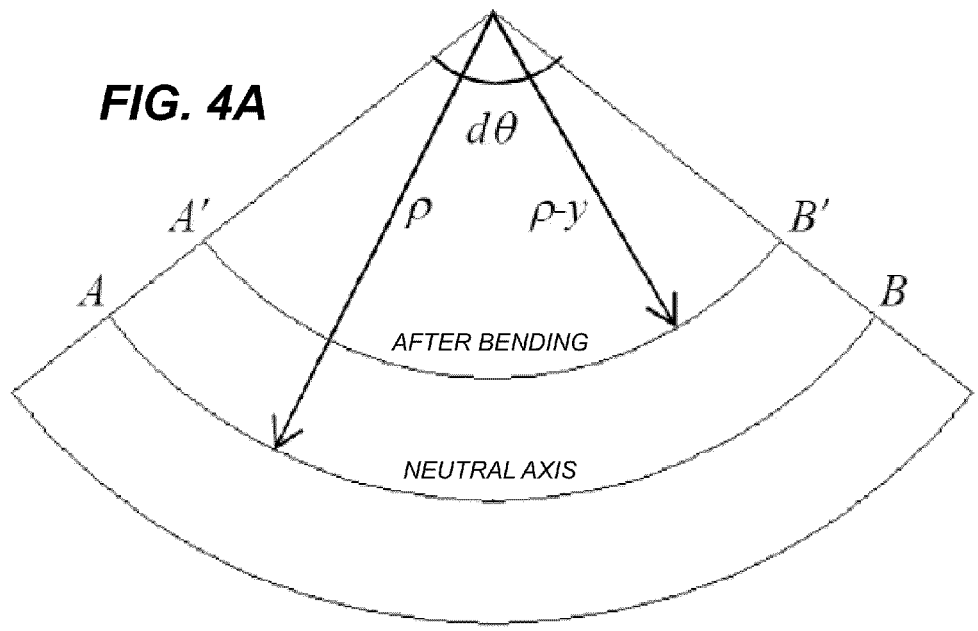
FIGS. 4A and 4B show an exemplary beam element after and bending, respectively.
Figure 4B:
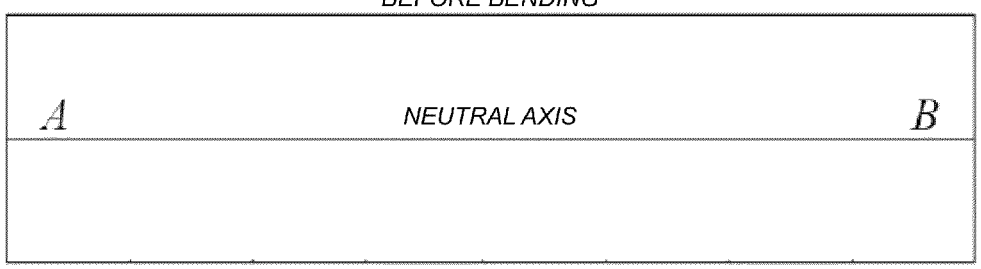

FIGS. 4A and 4B shows a (e.g., small) beam element after and bending, respectively. The beam type and actual loads does not affect the derivation of the bending strain equation. The neutral axis extends between points A and B. After bending (FIG. 4A), the line between points A' and B' is shorter than the neutral axis from A to B.

Figure 5:
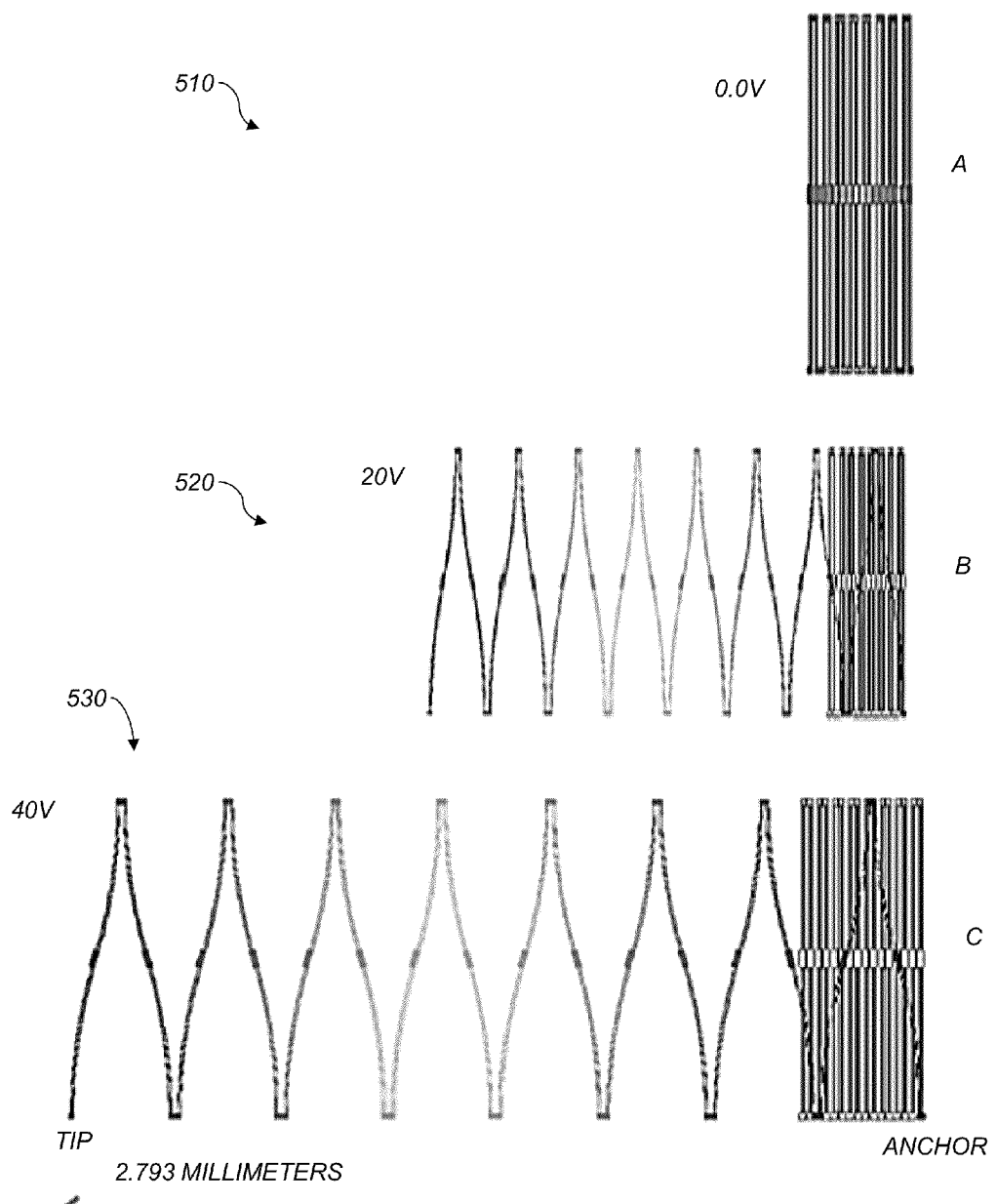
FIGS. 5 and 6 show configurations of exemplary actuators using multiple S-drives.
Figure 6:
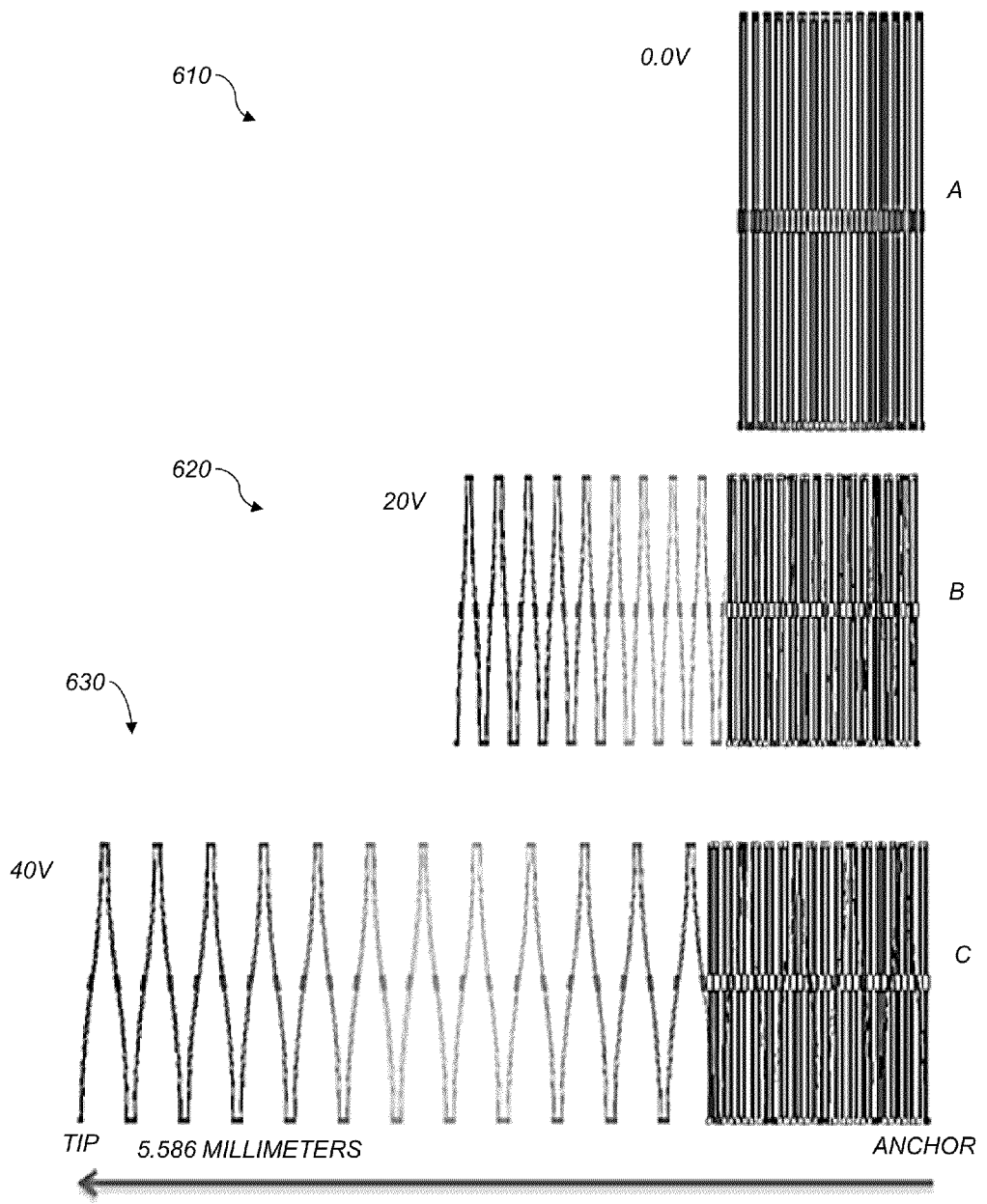

In various aspects, milli-meter displacements can be achieved by nesting S-drives as shown in FIGS. 5 and 6. FIG. 5 shows a simulation of a configuration with 16 S-drives. FIG. 6 shows a configuration with 32 S-drives. FIGS. 5 and 6 shows that doubling the voltage doubles the displacement, or doubling the number of S-drives with constant applied voltage doubles the displacement.

FIG. 5 shows a simulation of a nested S-Drive. View 610 shows the placement of 16 S-Drives, the right end of the actuator anchored. On application of 20V, the actuator chain deflects by a total of 1.39 mm as shown in view 520. For 40V the chain it deflects by 2.793 mm, as shown in view 530.

FIG. 6 shows a simulation of a nested S-Drive. View 610 shows the placement of 32 S-Drives, the right end of the actuator anchored. On application of 20 V the actuator chain deflects by 2.793 mm as shown in view 620. As shown in view 630, for 40V, the actuator chain deflects by 5.586 mm, as shown in view 630.

Figure 7:
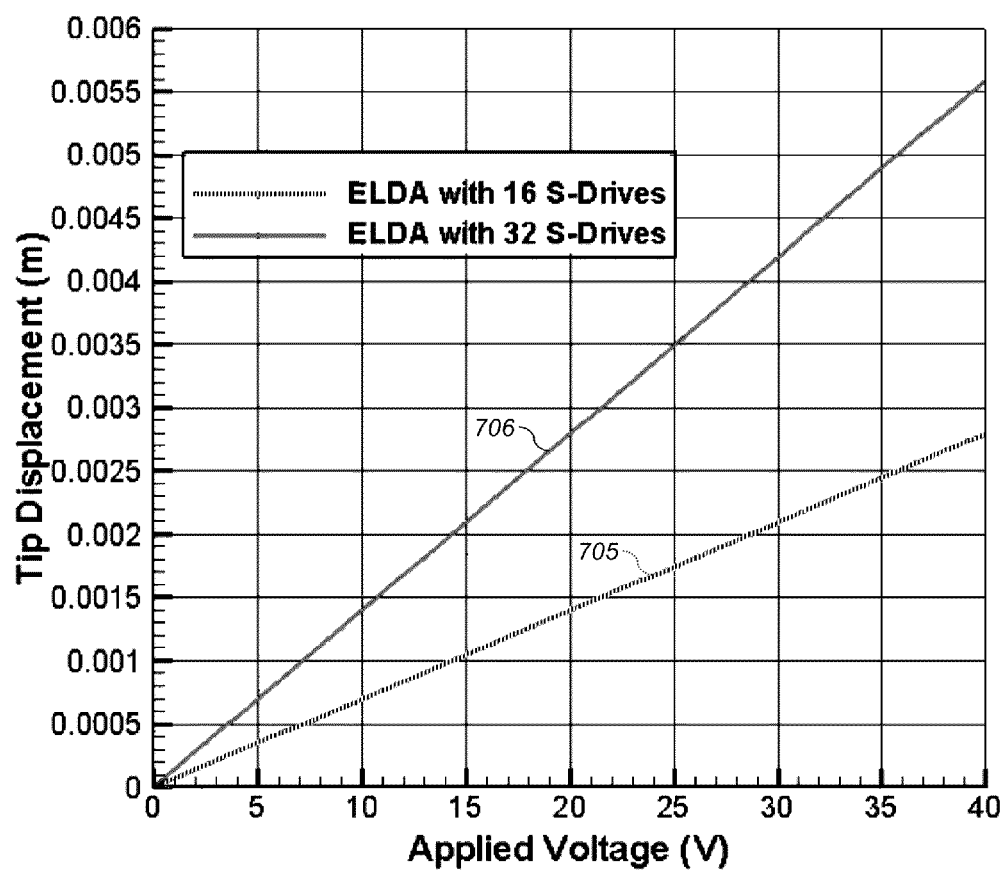
FIG. 7 is a graph showing actuator tip displacement versus applied voltage.

FIG. 7 shows tip displacement in m versus applied voltage (V). The voltage is varied from 0-40V. The displacement is substantially linear in applied voltage. Curve 705 shows the 16-S-drive configuration of an Extremely Large Deflection Actuator (ELDA), e.g., as shown in FIG. 5. Curve 706 shows the 32-S-drive configuration, e.g., as shown in FIG. 6.

In addition to large translational deflections, in various aspects, large rotational deflections can be achieved by nesting vertically-configured piezo-drives. Such a system is referred to herein as a "twistoflex" actuator.

Figure 8A:
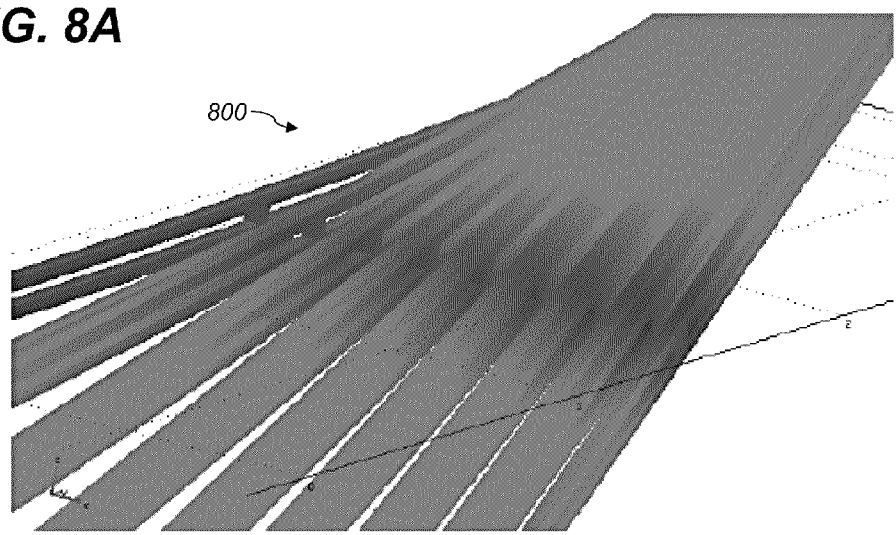
FIG. 8A shows a close-up of a simulation of vertically-configured piezo-drives during actuation.

FIG. 8A shows a close-up of a simulation of vertically-configured piezo-drives in actuator 800 during actuation. Each meandering piezo-drive rotates out-of-plane in the opposite direction of the one before. The assembly of a plurality of drives permits achieving a large effective rotation and out-of-plane motion (simulation shown from a wider perspective in FIG. 3B).

Figure 8B:
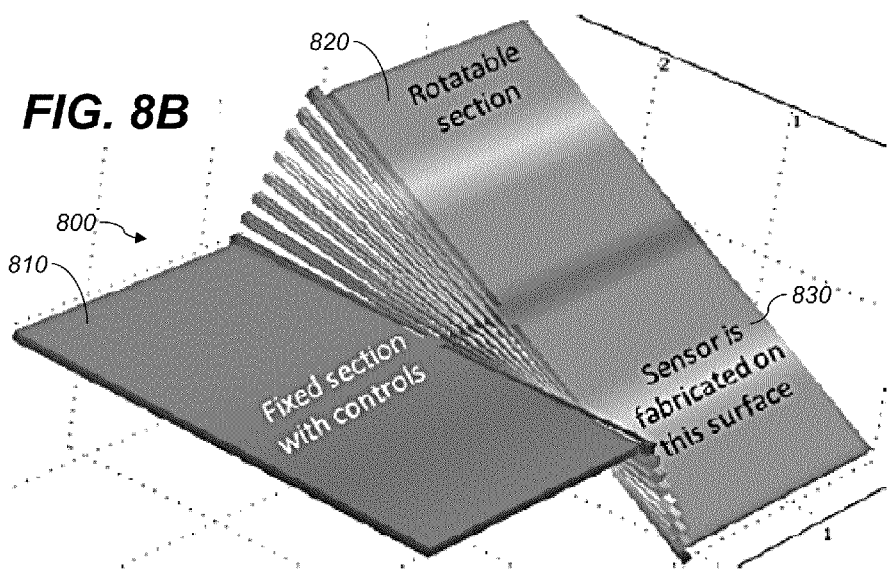
FIG. 8B is a perspective of a simulation of a rotational actuator according to various aspects.

FIG. 8B shows a wider view of a simulation of actuator 800. In FIG. 8B, section 810 of actuator 800 is a fixed section with controls. Section 820 is a rotatable section. Surface 830 is a surface on which a sensor can be fabricated.

Various aspects of piezoelectric microactuators described herein are adapted to produce extremely large translational (>100 microns) or rotational deflections (>10 degrees). In various aspects, a piezo material is sandwiched between two metal strips. Pairs of piezoelectric flexures are coupled to achieve large lateral deflections. Upon an application of voltage, one portion compresses while the other extends to produce an S-shape. Such mechanisms have been simulated deforming in-plane (e.g., FIG. 5) and out-of-plane (e.g., FIG. 8B). By nesting such piezo actuators, extremely large in-plane deflections and out-of-plane rotations can be achieved.

Various aspects described herein relate to a large deflection micro/nanopositioner with multiple degrees of freedom. A large deflection piezoelectric microrobotic manipulator with the ability to self-calibrate displacement and sense its position is described. Such a manipulator can be useful for scanning probe microscopy, nanolithography, data storage, biological probing in murky aqueous environments, and the like. Previous devices for such applications are limited in dexterity, range of motion, frequency response, positional calibration, or needed environmental cleanliness. Various devices described herein can advantageously achieve large deflections with greater than one degree of freedom (DOF); self-calibrate displacement; and sense position after actuation or a prescribed displacement. Through simulation-independent 3DOF motional control, positional sensing and self-calibration, and dynamic response can be employed.

The past two decades have seen advances in scanning probe microscopes and manipulators. The invention of scanning probe microscopes such as the scanning tunneling and atomic force microscope has revolutionized nanoscale research in various areas such as biology, materials science, optics, precision mechanics, and microelectronics [B1]-[B3].

Piezoelectric materials have been employed as actuators in these microscopes due to their high set point accuracy, high speed response, large dynamic range, high electrical mechanical coupling efficiency, and relatively small temperature sensitivity [B4]-[B5].

Conventional scanning probe microscopes typically include a passive cantilever hovering above, or attached to, a large macro-scale 3D piezoelectric positioning stage. When the tip moves in proximity to the investigated object, forces of interaction between the tip and the surface influence the movement of the cantilever. These movements are detected by selective sensors [B6]. Various interactions can be studied depending on the mechanics of the probe. Position sensing is typically achieved by a laser and photodiode system. Some prior microrobotic manipulators are not portable, are expensive, have difficultly operating in nontransparent biological environments, are confined to laboratory use, or are not able to examine specimens larger than a centimeter in height.

According to various aspects, a microrobotic manipulator includes piezoelectric material configured to achieve large 3D deflections. The system reduces the need for a large macro-scale positioning stage. The manipulator can include a piezoelectric positioning sensor that reduces the need for the typical laser-photodiode system. Manipulators according to various aspects can advantageously be small and portable, inexpensive, operable in murky nontransparent biological environments, usable outside the laboratory, or able to examine specimens of any height (since an underlying positional stage is not required).

Figure 9:
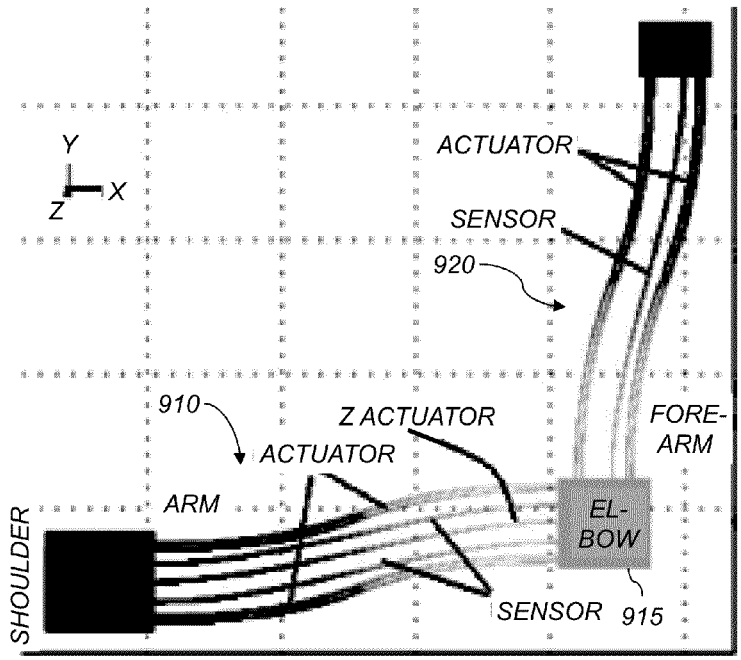
FIG. 9 is a plan view of a metrological multiaxis nanopositioning device.

FIG. 9 is a plan view of a metrological multiaxis nanopositioning device (e.g., a 3DOF, large-deflection, microrobotic arm) according to various aspects. Piezoelectric elements are used to simultaneously actuate and sense a displacement of an arm assembly. The multiaxis nanopositioning device includes two piezoelectric components (arm 910 and forearm 920) connected by elbow 915. The outermost flexures of the arm and forearm are piezoelectric actuators ("ACTUATOR"). These actuators provide y-axis deflection for the arm 910 and x-axis deflection for the forearm 920. The center flexure of the arm 910 is a piezoelectric actuator that provides out-of-plan z-axis motion ("Z ACTUATOR"). The remaining flexures are passive piezoelectric sensors for position sensing ("SENSOR").

In FIG. 1, independent y- and x-deflections are shown due to 40V applied. The piezoelectric displacements are due to the converse piezoelectric effect. The voltages can be supplied through electrodes located at the shoulder. Small axial contractions and extensions in the piezoelectric flexures ("ACTUATOR") yield large lateral deflections. In sensing, a displacement (of "SENSOR") generates a voltage that can be calibrated by using gap stops, as discussed below.

The actuating function of the arm is achieved by adding a voltage excitation to the control signal to actuate the piezoelectric arm. And sensing function is automatically achieved due to the piezoelectric effect, which means an applied mechanical stress will generate a voltage. To consider the actuating mechanism, the converse piezoelectric effect can be written as [B7]:

$$X_i = d_{ki} E_k \tag{19}$$

where $X_i$ is the strain tensor, $d_{ki}$ is the converse piezoelectric coefficient, and $E_k$ is the electric field. In the design, the field is applied in the z direction, through the thickness of the material, that is $E_3$, and the piezoelectric coefficient is $d_{31}$. Thus, the resulting strain is $$X_1 = d_{31} E_3. \tag{20}$$

Figure 10:
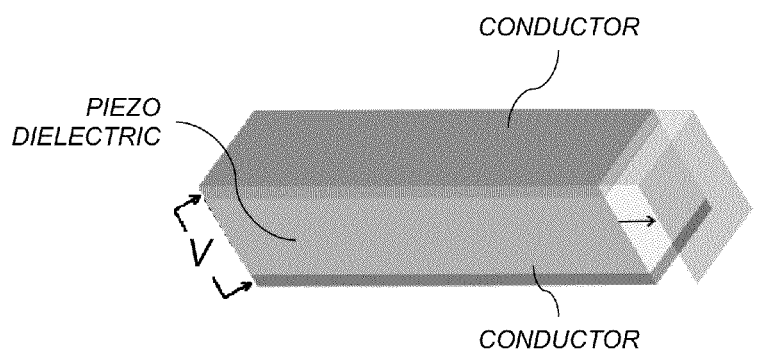
FIG. 10 shows an exemplary piezoelectric element.
Figure 11A:
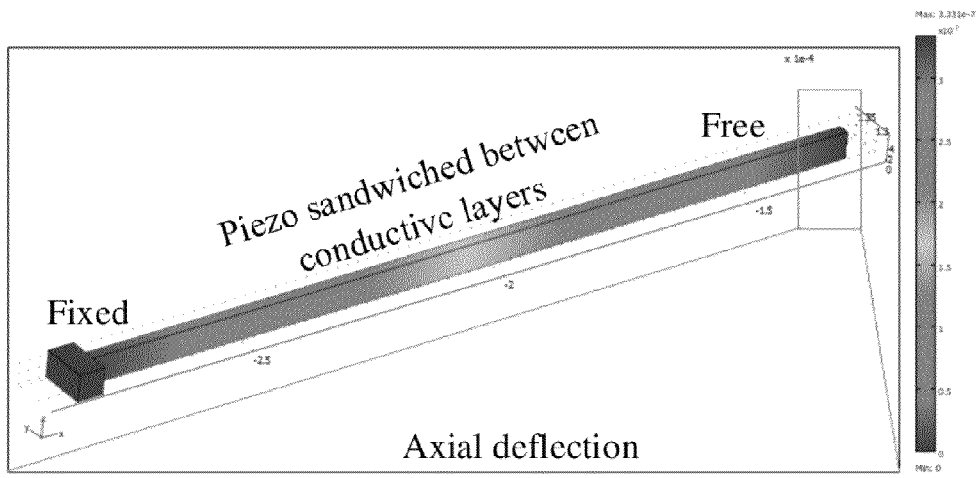
FIGS. 11A and 11B show simulated finite-element analyses (FEAs) of an exemplary piezoelectroc structure.
Figure 11B:
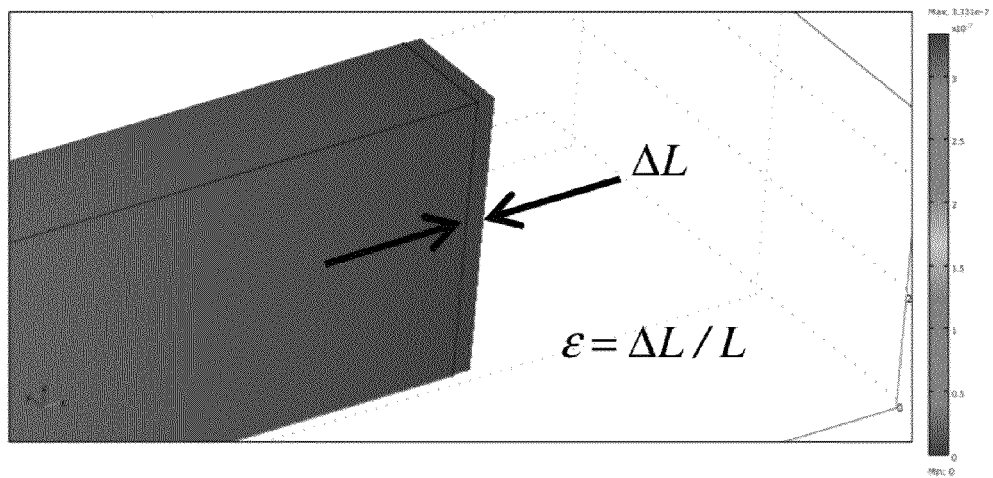

FIGS. 10, 11A, and 11B show an example of the actuation mechanism. An applied voltage causes a small axial deformation of the piezoelectric of about, e.g., one thousandth of its length, e.g., displacement of the piezoelectric material used in the arm. Voltage applied across the piezoelectric material produces a small axial deflection of about a thousandth of its original length when 40V is applied through a 2 µm thick layer. FIG. 10 depicts the conductive layers, piezo material, and applied voltage V. FIGS. 11A and 11B show finite-element analyses (FEAs) of a structure as simulated in COMSOL. The structure is a beam having a fixed end and a free end, as shown in FIG. 11A. FIG. 11B is a zoomed-in image showing axial displacement of 0.33 µm for this 300 µm flexure when voltage is applied.

Figure 12:
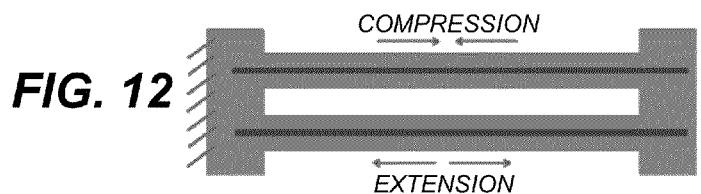
FIG. 12 is a plan view of two exemplary composite flexures coupled at their ends.
Figure 13:
FIG. 13 is a simulation of the results of applying voltage to an exemplary flexure configuration similar to that shown in FIG. 12.
Figure 14:
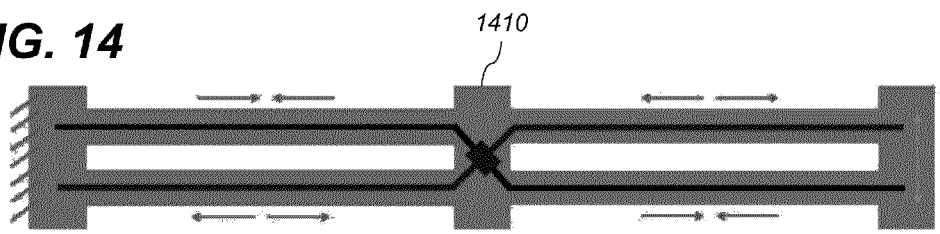
FIG. 14 is a plan view of four coupled piezoelectric elements.
Figure 15:
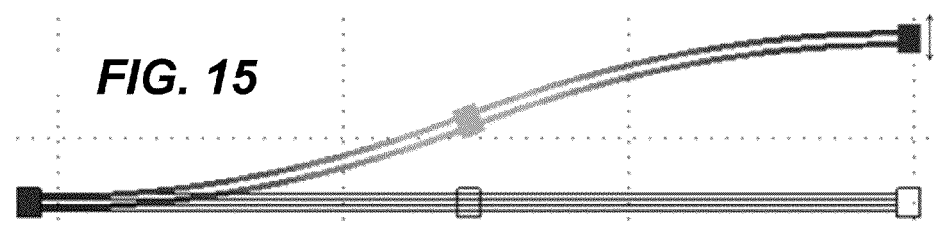
FIG. 15 is a simulation of the results of applying voltage to an exemplary flexure configuration similar to that shown in FIG. 14.
Figure 16:
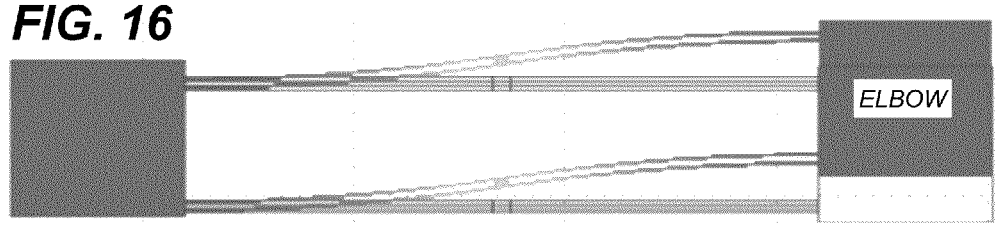
FIG. 16 is a simulation of the results of applying voltage to an exemplary structure having two flexures similar to that shown in FIG. 14.
Figure 17:
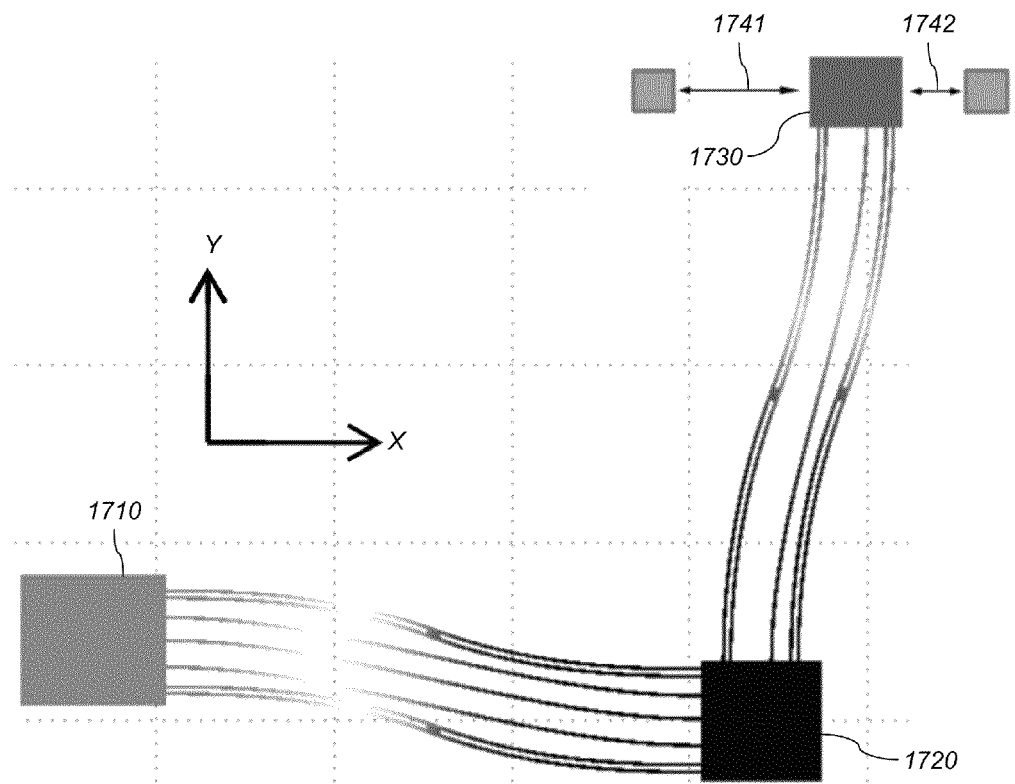
FIG. 17 shows a self-calibratable nanopositioner according to various aspects.

FIG. 12 is a schematic of two composite flexures coupled at their ends. FIG. 13 is a simulation showing that when the flexures are so coupled, applied voltage results in a large lateral displacement. The deflections shown in FIGS. 13, 15, and 17 are not magified; a small axial extension is converted by the coupling into a large lateral deflection. FIG. 14 shows a schematic, and FIG. 15 a simulation, of a flexure with a length of 300 microns. Out of plane deflection is achieved with a third piezoelectric flexure (see FIG. 9) that is positioned at a different elevation than the planar piezoelectric flexures. FIG. 16 shows an orthogonal arm joint at the elbow. Various aspects are metrological multiaxis positioning devices.

Referring back to FIG. 13, displacement of the piezoelectric-arm is shown. Two composite flexures are coupled at their ends, then the same voltage is applied to both. This results in a large lateral displacement (in an example, an axial extension of 0.1% can result in a lateral deflection of about 33% of the length of the flexure). FIG. 14 shows a series connection of two of the structure shown in FIG. 12. The resulting beam has an 'S' shape when actuated. A (Small) Compression on one side and (small) extension on the other side, together with a cross-over extension 1410, yields large lateral deflection, as shown in FIG. 15. The structure shown in FIG. 14 is thus referred to herein as an "S-flexure." FIG. 16 shows Parallel connection of two structures as shown in FIG. 14 (S-flexures), both connecting at the 'elbow', composes part of the multi-axis nanopositioning device.

Electro micro metrology (EMM) is an accurate, precise, and practical method for extracting effective mechanical measurements of MEMS [B8], [B9]. It works by leveraging the strong and sensitive coupling between microscale mechanics and electronics through fundamental electromechanical relationships. What results are expressions that relate fabricated mechanical properties in terms of electrical measurands. Various aspects use similar techniques to calibrate displacements.

FIG. 17 shows a self-calibratable nanopositioner according to various aspects. Shoulder 1710, elbow 1720, and probe 1730 are as shown in FIG. 9. Gaps 1741, 1742 can be used for displacement calibration. A set of self-calibratable sensors are fabricated with the positioner. Two are shown here. In y direction, the same scheme can be used. The displacements as functions of applied voltages are what calibrate the piezoelectric robot arm.

The voltages sensed by closing two unequal gaps 1741, 1742 are used to measure overcut due to process variations. The two gaps are related by $gap_{2,layout} = n \times gap_{1,layout}$, where $n \neq 1$ is a layout parameter. If the distance traveled to close each gap can be considered to be a small linear deflection, then the relationship between the gap sizes and voltages sensed is $$\frac{gap_1}{V_{1,sense}} = \frac{gap_2}{V_{2,sense}} \tag{21}$$

$$\frac{gap_{1,layout} + \Delta gap}{V_{1,sense}} = \frac{n \cdot gap_{1,layout} + \Delta gap}{V_{2,sense}} \tag{22}$$

where $gap_{j,layout}$ is the known layout gap and $$\Delta gap = gap_j - gap_{j,layout}$$

is the difference in geometry between unknown fabrication and layout. $V_{j,sense}$ is the voltage generated by the converse piezoelectricity due to the stress in closing each gap. Solving (22) for overcut, $$\Delta gap = \left( \frac{n \frac{V_{1,sense}}{V_{2,sense}} - 1}{1 - \frac{V_{1,sense}}{V_{2,sense}}} \right) \cdot gap_{1,layout} \tag{23}$$

Then, the displacement-voltage constant can be obtained based on $$\Psi = \frac{gap_{1,layout} + \Delta gap}{V_{1,sense}} \tag{24}$$

From equation (24), in the specific range, the displacement x can be written as $$x = \Psi V_{1,sense}. \tag{25}$$

However, at greater distances this relationship can be shown to be nonlinear. Additional gaps can be implemented to obtain more data points to fit the performance according to nonlinear theory.

Figure 18:
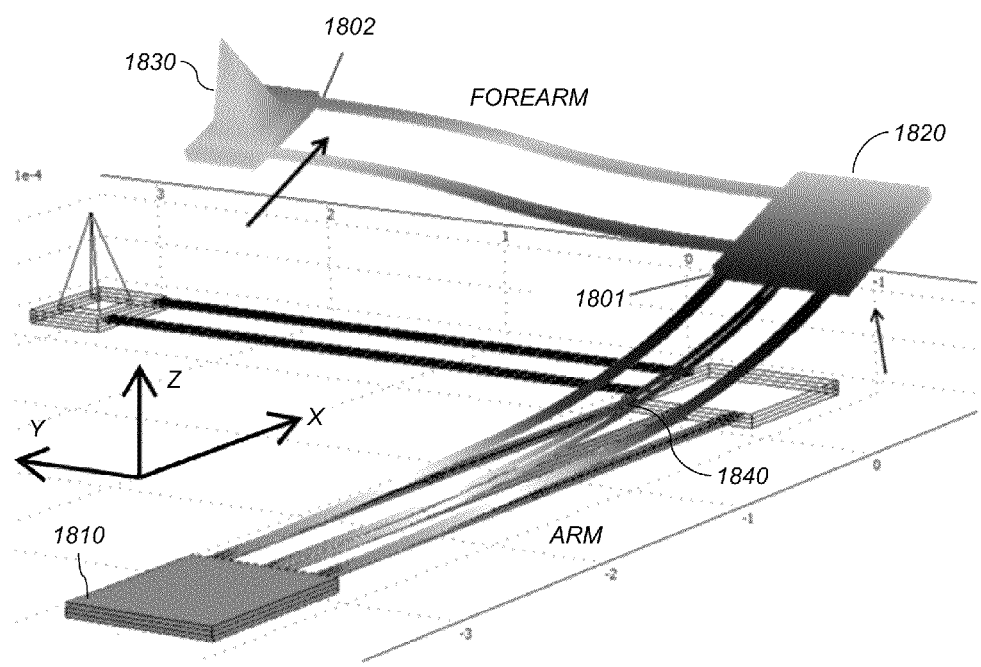
FIG. 18 shows displacement of an exemplary microrobotic manipulator without feedback.

FIG. 18 shows displacement of a microrobotic manipulator without feedback. Anchor shoulder 1810, elbow 1820, and probe 1830 are shown. As analyzed in Section 2, 3D displacement is achieved by applying proper voltage on actuator beams (S-flexures). The displacement along x-axis is controlled by the forearm, and the displacement along the y axis is controlled by outer two beams of the arm. The center beam 1840 of the arm is an actuator (S-flexure) for the z direction.

FIG. 18 also shows the 3DOF motion of the microrobotic manipulator. Various microrobotic manipulators described herein can accurately track desired positions without the need for a position feedback signal. Positioning sensitivity is discussed below with reference to maximum-displacement points 1801, 1802.

Figure 19A:
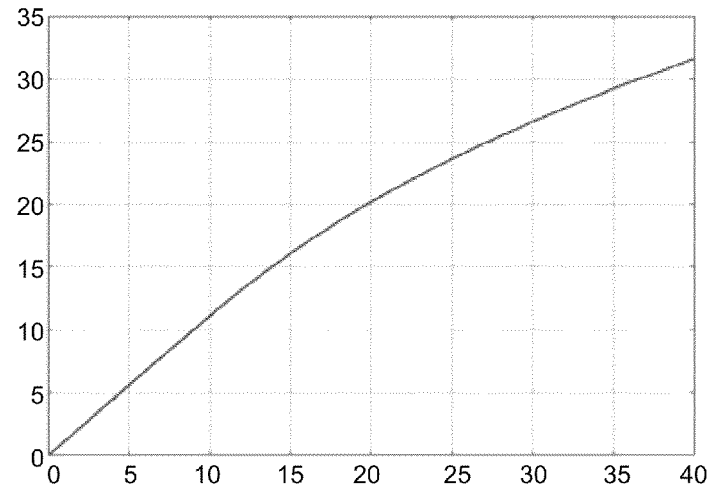
FIGS. 19A and 19B show exemplary relationships between displacement and applied voltage.
Figure 19B:
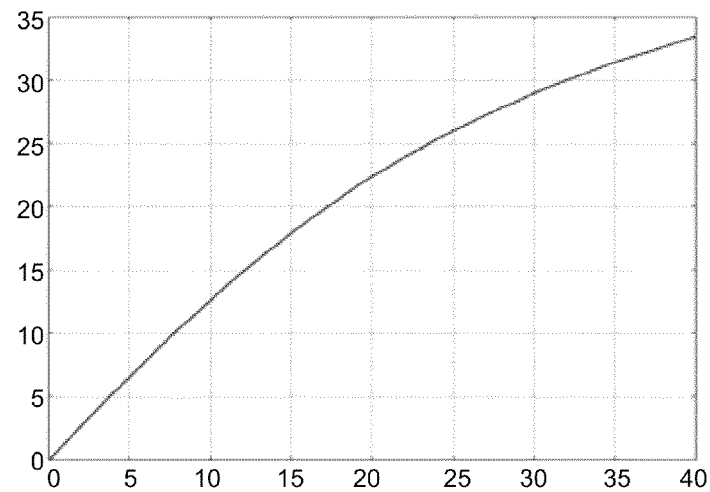

FIGS. 19A and 19B show exemplary relationships between displacement and applied voltage. FIG. 19A shows the relationship between displacement in the y-axis, and the applied voltage for the arm (i.e., voltage applied to the S-flexures in the arm that translate along the y-axis). In a small range, from 0V to ~20V, the relation is linear. Out of this range, the relationship is nonlinear. FIG. 19B shows the relationship between displacement in the x-axis and the applied voltage for the forearm. The linear and nonlinear ranges in FIG. 19B are similar to those of FIG. 19A. FIG. 19A shows y-displacement in µm vs. applied voltage in V. The abscissa is applied voltage (V) and the ordinate is y-displacement (µm). FIG. 19B is the same, except for x-displacement instead of y-displacement.

In these exemplary relationships, displacements in x- and y-axes can reach 33.4 µm and 31.6 µm, respectively. For a given structure, the displacement range can depend at least in part on applied voltage, piezoelectric constant, geometric design, dielectric breakdown strength of the materials used, or strain limit. For a substantially constant beam thickness, the upper and lower bounds of the beam in z direction can be regarded as a charged parallel plate capacitor and the relationship between voltage and potential field can be written as $$E_3 = \frac{V}{d} \qquad (26)$$

where d is the layer thickness and $E_3$ is the potential field in the z direction. From (20) and (26), it can be easily seen that the displacement here is proportional to input voltage. Thus, when the applied voltage is negative, a similar sensitivity plot in a negative sign can be obtained. Thus, within the large linear range from −20 µm to 20 µm, the system mechanism can be treated as a substantially linear model, which greatly facilitates precise predictions of output displacements.

To control the microrobotic manipulator in the nonlinear range, feedback sensitivity, a displacement self-calibration scheme, and a control algorithm should be applied.

Figure 20A:
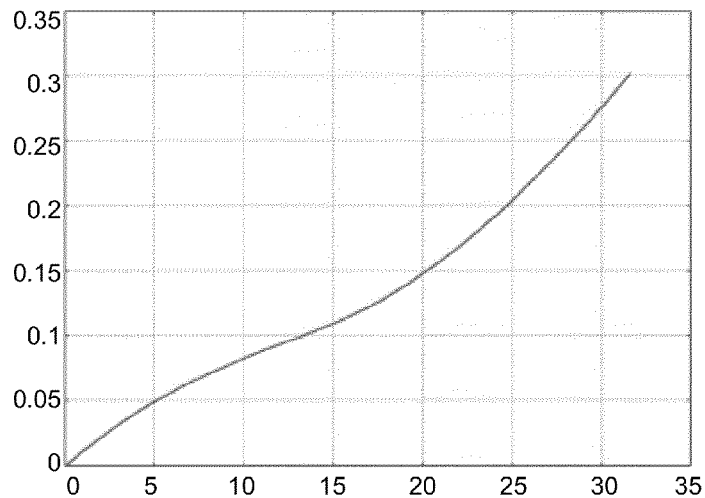
FIGS. 20A and 20B show an exemplary nonlinear relationship between the displacement and sensed electric potential.
Figure 20B:
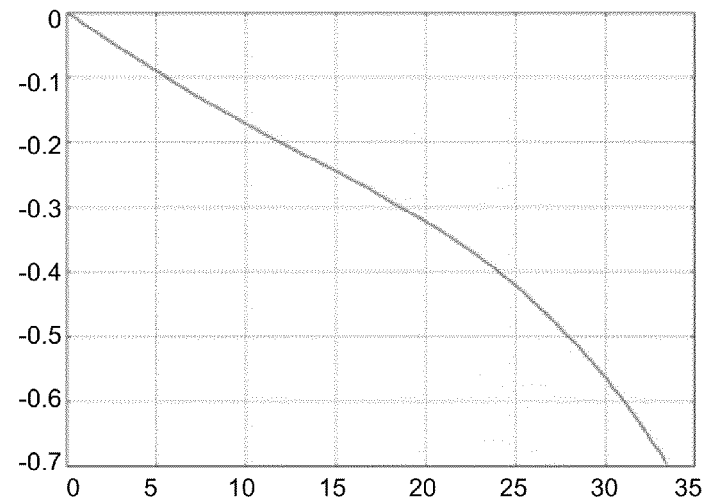

FIGS. 20A and 20B show a nonlinear relationship between the displacement and sensed electric potential. For displacement within range from 0 µm to 20 µm, the relationship is linear, and out of this range, the relationship is highly nonlinear. FIG. 20A shows sensed electric potential in V (ordinate) vs. displacement in y direction in µm for the arm (abscissa). FIG. 20B shows sensed electric potential in V (ordinate) vs. displacement in the x direction in µm for the forearm (abscissa).

The displacement and the sensed electric potential for arm and forearm are related due to the piezoelectric effect. Within range from 0 µm to 20 µm, the relationship is linear. For larger displacement, it continues on a quadratic trend.

Figure 21:
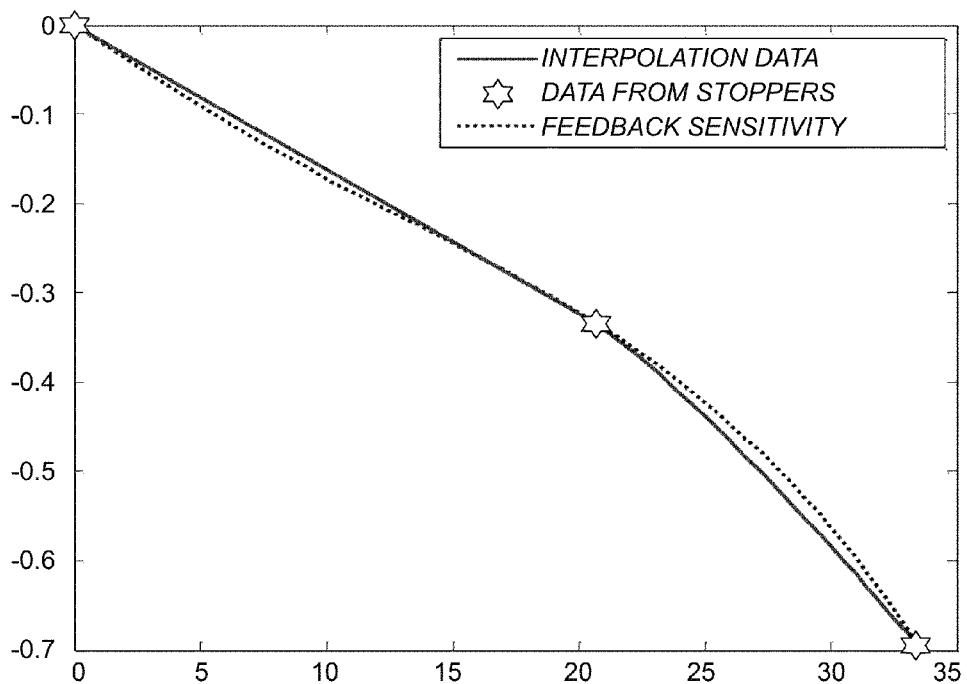
FIG. 21 shows results of an exemplary self-calibration process.

Based on the analysis of feedback sensitivity, a piecewise calibration scheme can be used. Two stoppers are added for calibration; data from the 0V original position of the probe is also used. The positions of the stoppers lie on the opposite sides of the original point where the probe 1730 (FIG. 17) is when no voltage is applied. The distance from the original point is 20 µm (gap1, e.g., gap 1741, FIG. 17) and 34 µm (gap2, e.g., gap 1742, FIG. 17), respectively. For the linear range, a displacement-voltage proportionality constant can be easily obtained by measuring a sensed electric potential required to close gap1 (gap 1741, FIG. 17). For the nonlinear range of the feedback sensitivity, nonlinear fitting theory is introduced. A piecewise-Cubic Hermite Interpolation method can be used to fit the sensitivity function according to the stoppers' positions from the original point and the sensed electric potentials. FIG. 21 shows the self-calibration result. FIG. 21 shows that the interpolation data matches well with the experimental results of feedback sensitivity. In this plot, The solid line is the interpolation data, the star markers show the positions of the stoppers, and the dashed line is the actual feedback sensitivity. The abscissa is x displacement in µm; the ordinate is sensed electric potential in V.

Described herein are microrobotic manipulators with position feedback according to various aspects. Both actuation and position sensing are achieved through the piezoelectric phenomenon. The performance of the novel microrobotic manipulator can be explored using nonlinear computer modeling, e.g., to examine its positioning sensitivity, its feedback sensitivity, and its self-calibration scheme.

Piecewise self-calibration techniques according to various aspects have been simulated and thereby shown to be effective. These techniques permit re-calibrating after long-term dormancy or after harsh environmental changes. Various aspects of the manipulator are capable of large deflection, a high degree of precision, and multiple degrees of freedom.

Figure 22:
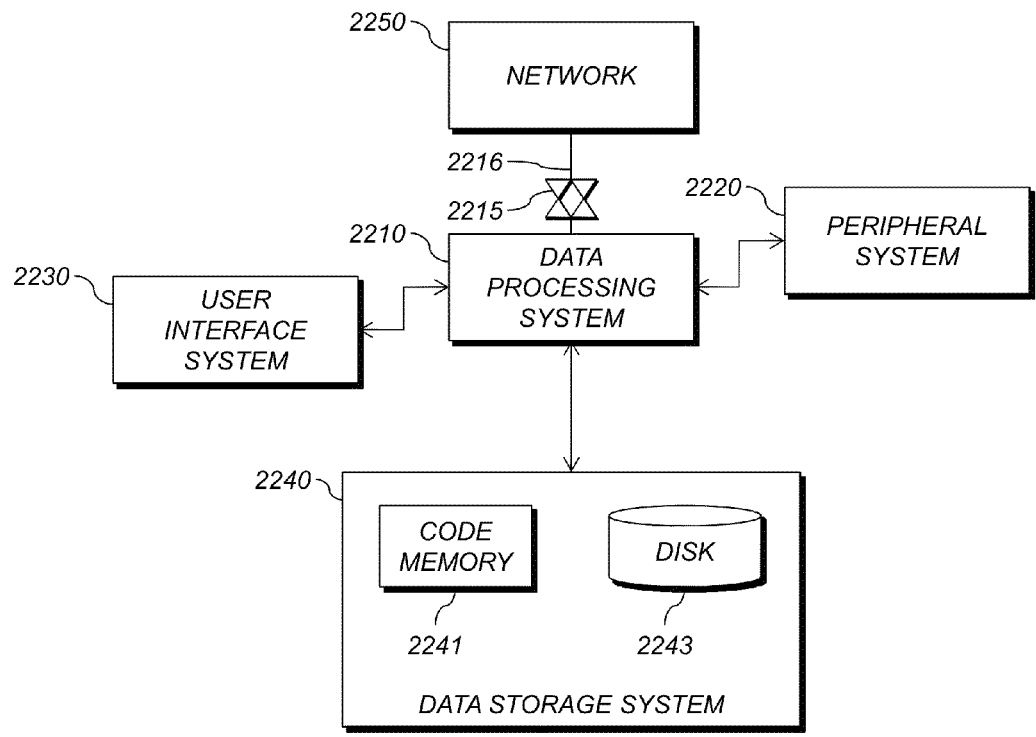
FIG. 22 is a high-level diagram showing components of a data-processing system.

FIG. 22 is a high-level diagram showing the components of an exemplary data-processing system for analyzing data and performing other analyses described herein. The system includes a data processing system 2210, a peripheral system 2220, a user interface system 2230, and a data storage system 2240. The peripheral system 2220, the user interface system 2230 and the data storage system 2240 are communicatively connected to the data processing system 2210. Data processing system 2210 can be communicatively connected to network 2250, e.g., the Internet or an X.25 network, as discussed below. For example, voltage source 110 (FIG. 1), and other voltage sources described herein, can be controlled by a system 2210 that can includes or be connected to one or more of systems 2220, 2230, 2240, or can connect to one or more network(s) 2250.

The data processing system 2210 includes one or more data processor(s) that implement processes of various aspects described herein. A "data processor" is a device for automatically operating on data and can include a central processing unit (CPU), a desktop computer, a laptop computer, a mainframe computer, a personal digital assistant, a digital camera, a cellular phone, a smartphone, or any other device for processing data, managing data, or handling data, whether implemented with electrical, magnetic, optical, biological components, or otherwise.

The phrase "communicatively connected" includes any type of connection, wired or wireless, between devices, data processors, or programs in which data can be communicated. Subsystems such as peripheral system 2220, user interface system 2230, and data storage system 2240 are shown separately from the data processing system 2210 but can be stored completely or partially within the data processing system 2210.

The data storage system 2240 includes or is communicatively connected with one or more tangible non-transitory computer-readable storage medium(s) configured to store information, including the information needed to execute processes according to various aspects. A "tangible non-transitory computer-readable storage medium" as used herein refers to any non-transitory device or article of manufacture that participates in storing instructions which may be provided to a processor, e.g., in data-processing system 2210, for execution. Such a non-transitory medium can be non-volatile or volatile. Examples of non-volatile media include floppy disks, flexible disks, or other portable computer diskettes, hard disks, magnetic tape or other magnetic media, Compact Discs and compact-disc read-only memory (CD-ROM), DVDs, BLU-RAY disks, HD-DVD disks, other optical storage media, Flash memories, read-only memories (ROM), and erasable programmable read-only memories (EPROM or EEPROM). Examples of volatile media include dynamic memory, such as registers and random access memories (RAM). Storage media can store data electronically, magnetically, optically, chemically, mechanically, or otherwise, and can include electronic, magnetic, optical, electromagnetic, infrared, or semiconductor components.

Aspects of the present invention can take the form of a computer program product embodied in one or more tangible non-transitory computer readable medium(s) having computer readable program code embodied thereon. Such medium(s) can be manufactured as is conventional for such articles, e.g., by pressing a CD-ROM. The program embodied in the medium(s) includes computer program instructions that can direct data processing system 2210 to perform a particular series of operational steps when loaded, thereby implementing functions or acts specified herein.

In an example, data storage system 2240 includes code memory 2241, e.g., a random-access memory, and disk 2243, e.g., a tangible computer-readable rotational storage device such as a hard drive. Computer program instructions are read into code memory 2241 from disk 2243, or a wireless, wired, optical fiber, or other connection. Data processing system 2210 then executes one or more sequences of the computer program instructions loaded into code memory 2241, as a result performing process steps described herein. In this way, data processing system 2210 carries out a computer implemented process. For example, blocks of the flowchart illustrations or block diagrams herein, and combinations of those, can be implemented by computer program instructions. Code memory 2241 can also store data, or not: data processing system 2210 can include Harvard-architecture components, modified-Harvard-architecture components, or Von-Neumann-architecture components.

Computer program code can be written in any combination of one or more programming languages, e.g., JAVA, Smalltalk, C++, C, or an appropriate assembly language. Program code to carry out methods described herein can execute entirely on a single data processing system 2210 or on multiple communicatively-connected data processing systems 2210. For example, code can execute wholly or partly on a user's computer and wholly or partly on a remote computer or server. The server can be connected to the user's computer through network 2250.

The peripheral system 2220 can include one or more devices configured to provide digital content records to the data processing system 2210. For example, the peripheral system 2220 can include digital still cameras, digital video cameras, cellular phones, or other data processors. The data processing system 2210, upon receipt of digital content records from a device in the peripheral system 2220, can store such digital content records in the data storage system 2240.

The user interface system 2230 can include a mouse, a keyboard, another computer (connected, e.g., via a network or a null-modem cable), or any device or combination of devices from which data is input to the data processing system 2210. In this regard, although the peripheral system 2220 is shown separately from the user interface system 2230, the peripheral system 2220 can be included as part of the user interface system 2230.

The user interface system 2230 also can include a display device, a processor-accessible memory, or any device or combination of devices to which data is output by the data processing system 2210. In this regard, if the user interface system 2230 includes a processor-accessible memory, such memory can be part of the data storage system 2240 even though the user interface system 2230 and the data storage system 2240 are shown separately in FIG. 22.

In various aspects, data processing system 2210 includes communication interface 2215 that is coupled via network link 2216 to network 2250. For example, communication interface 2215 can be an integrated services digital network (ISDN) card or a modem to provide a data communication connection to a corresponding type of telephone line. As another example, communication interface 2215 can be a network card to provide a data communication connection to a compatible local-area network (LAN), e.g., an Ethernet LAN, or wide-area network (WAN). Wireless links, e.g., WiFi or GSM, can also be used. Communication interface 2215 sends and receives electrical, electromagnetic or optical signals that carry digital data streams representing various types of information across network link 2216 to network 2250. Network link 2216 can be connected to network 2250 via a switch, gateway, hub, router, or other networking device.

Network link 2216 can provide data communication through one or more networks to other data devices. For example, network link 2216 can provide a connection through a local network to a host computer or to data equipment operated by an Internet Service Provider (ISP).

Data processing system 2210 can send messages and receive data, including program code, through network 2250, network link 2216 and communication interface 2215. For example, a server can store requested code for an application program (e.g., a JAVA applet) on a tangible non-volatile computer-readable storage medium to which it is connected. The server can retrieve the code from the medium and transmit it through the Internet, thence a local ISP, thence a local network, thence communication interface 2215. The received code can be executed by data processing system 2210 as it is received, or stored in data storage system 2240 for later execution.

The invention is inclusive of combinations of the aspects described herein. References to "a particular aspect" and the like refer to features that are present in at least one aspect of the invention. Separate references to "an aspect" or "particular aspects" or the like do not necessarily refer to the same aspect or aspects; however, such aspects are not mutually exclusive, unless so indicated or as are readily apparent to one of skill in the art. The use of singular or plural in referring to "method" or "methods" and the like is not limiting. The word "or" is used in this disclosure in a non-exclusive sense, unless otherwise explicitly noted.

The invention has been described in detail with particular reference to certain preferred aspects thereof, but it will be understood that variations, combinations, and modifications can be effected by a person of ordinary skill in the art within the spirit and scope of the invention.

The invention claimed is:

1. An actuator, comprising:
   a) a plurality of S-drives, each having a first end and a second end, the S-drives mechanically connected in series at their first ends and second ends alternately, each S-drive including:
      i) four piezoelectric elements disposed substantially in a respective common plane of the S-drive and arranged as a first and a second pair of the piezoelectric elements, the piezoelectric elements in each pair spaced apart and mechanically coupled at their ends, and the first and second pairs mechanically connected in series to define the first and second ends of the S-drives; and
      ii) first and second electrodes arranged so that voltage applied to the first electrode causes deformation of a first piezoelectric element of the first pair and a second piezoelectric element of the second pair, and voltage applied to the second electrode causes deformation of a second piezoelectric element of the first pair and a first piezoelectric element of the second pair;

iii) one or more common electrode(s), each common electrode arranged opposite the first electrode or opposite the second electrode in a direction substantially normal to the respective common plane; and b) a controller adapted to selectively apply voltage of a first polarity between the first electrode and at least one of the common electrode(s) facing the first electrode, and contemporaneously apply voltage of a second polarity opposite to the first polarity between the second electrode and at least one of the common electrode(s) facing the second electrode, so that each of the S-drives deflects substantially in the respective common plane and substantially in a common deflection direction.

2. The actuator according to claim 1, wherein the plurality of S-drives includes 16 or 32 S-drives.

3. The actuator according to claim 1, further including an anchor mechanically connected to one of the plurality of S-drives at an end of the series.

4. The actuator according to claim 1, wherein the first electrode of a first one of the plurality of S-drives is electrically connected to the second electrode of an adjacent second one of the plurality of S-drives, and the second electrode of the first one of the plurality of S-drives is electrically connected to the first electrode of the second one of the plurality of S-drives.

* * * * *